(12) United States Patent
Wang et al.

(10) Patent No.: US 9,632,369 B2
(45) Date of Patent: Apr. 25, 2017

(54) ARRAY SUBSTRATE AND MANUFACTURING METHOD THEREOF, AS WELL AS DISPLAY DEVICE

(71) Applicants: Boe Technology Group Co., Ltd., Beijing (CN); Beijing Boe Optoelectronics Technology Co., Ltd., Beijing (CN)

(72) Inventors: Zhenwei Wang, Beijing (CN); Kaixuan Wang, Beijing (CN); Yezhou Fang, Beijing (CN); Hong Zhu, Beijing (CN); Hongjun Yu, Beijing (CN)

(73) Assignees: Boe Technology Group Co., Ltd., Beijing (CN); Beijing Boe Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 14/785,811

(22) PCT Filed: Mar. 16, 2015

(86) PCT No.: PCT/CN2015/074284
§ 371 (c)(1),
(2) Date: Oct. 20, 2015

(87) PCT Pub. No.: WO2016/065798
PCT Pub. Date: May 6, 2016

(65) Prior Publication Data
US 2016/0266445 A1    Sep. 15, 2016

(30) Foreign Application Priority Data
Oct. 29, 2014 (CN) .......................... 2014 1 0592074

(51) Int. Cl.
*G02F 1/1343* (2006.01)
*G02F 1/1333* (2006.01)
(Continued)

(52) U.S. Cl.
CPC .... *G02F 1/134309* (2013.01); *G02F 1/13439* (2013.01); *G02F 1/133345* (2013.01);
(Continued)

(58) Field of Classification Search
CPC ............... H01L 27/124; H01L 27/1262; G02F 1/136286; G02F 1/133345; G02F 1/134309; G02F 1/13439
See application file for complete search history.

(56) References Cited

U.S. PATENT DOCUMENTS

2004/0125300 A1* 7/2004 Lee .................. G02F 1/134363
349/141
2005/0078256 A1* 4/2005 Hong ................ G02F 1/134363
349/141
(Continued)

FOREIGN PATENT DOCUMENTS

CN    101144952    3/2008
CN    102236229    11/2011
(Continued)

OTHER PUBLICATIONS

International Search Report and Written Opinion from PCT/CN15/074284 dated Jul. 17, 2015.
(Continued)

*Primary Examiner* — Karen Kusumakar
(74) *Attorney, Agent, or Firm* — Calfee, Halter & Griswold LLP

(57) ABSTRACT

Embodiments of the present invention disclose an array substrate and a manufacturing method thereof, as well as a display device, which relates to the field of display, and can increase transmittance at the edge of a pixel, thereby improving display effect. The array substrate provided by the present invention comprises: a common electrode and pixel electrodes, the array substrate further comprises an
(Continued)

auxiliary common electrode arranged between adjacent pixel electrodes and electrically connected with the common electrode.

13 Claims, 3 Drawing Sheets

(51) Int. Cl.
*H01L 21/77* (2006.01)
*H01L 27/12* (2006.01)
*G02F 1/1362* (2006.01)

(52) U.S. Cl.
CPC ........ *G02F 1/136286* (2013.01); *H01L 21/77* (2013.01); *H01L 27/12* (2013.01); *H01L 27/124* (2013.01); *H01L 27/1262* (2013.01); *G02F 2001/134318* (2013.01); *G02F 2001/134372* (2013.01)

(56) References Cited

U.S. PATENT DOCUMENTS

| | | | |
|---|---|---|---|
| 2008/0094559 A1* | 4/2008 | Lee | G02F 1/136213 349/143 |
| 2008/0100785 A1 | 5/2008 | Igeta et al. | |
| 2013/0242215 A1* | 9/2013 | Chang | G02F 1/136204 349/41 |

FOREIGN PATENT DOCUMENTS

| | | |
|---|---|---|
| CN | 102830557 | 12/2012 |
| CN | 103454817 | 12/2013 |
| CN | 203444217 | 2/2014 |
| CN | 103616784 | 3/2014 |
| CN | 103941488 | 7/2014 |
| CN | 103941488 A * | 7/2014 |
| CN | 104280963 | 1/2015 |

OTHER PUBLICATIONS

Office action from Chinese Application No. 201410592074.9 dated Jul. 15, 2016.
Office Action from China Application No. 201410592074.9 dated Jan. 12, 2017.

* cited by examiner

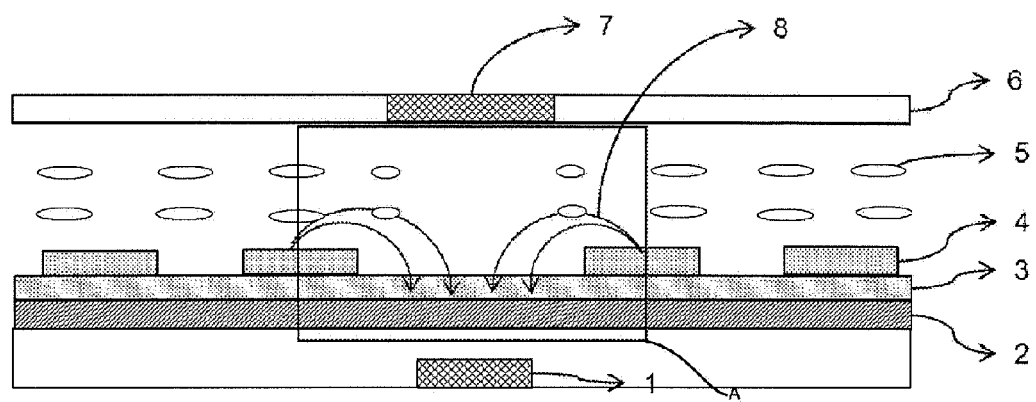
FIG 1 : PRIOR ART
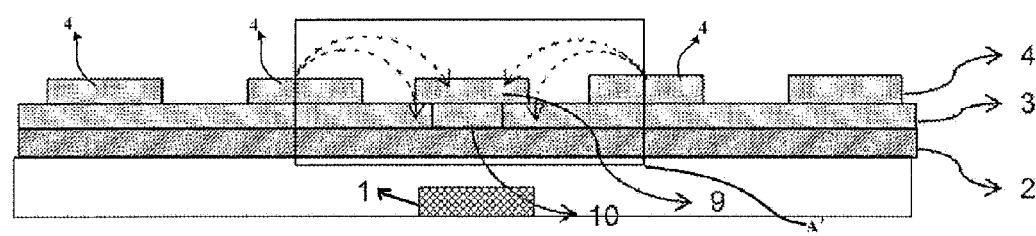
Fig. 2

ARRAY SUBSTRATE AND MANUFACTURING METHOD THEREOF, AS WELL AS DISPLAY DEVICE

RELATED APPLICATIONS

This application is the U.S. national stage entry of PCT/CN2015/074284, filed Mar. 16, 2015, which claims priority to Chinese Application No. 201410592074.9, filed Oct. 29, 2014, the entire disclosures of which are incorporated by reference herein.

FIELD OF THE INVENTION

The present invention relates to the field of display, particularly to an array substrate and a manufacturing method thereof, as well as a display device.

BACKGROUND OF THE INVENTION

The Fringe Field Switching (FFS) display mode is one of plane field modes, which has advantages of high transmittance and clear images.

FIG. 1 is a structural schematic view of a display device in a FFS mode. An insulating layer is formed after a data line 1 of an array substrate is formed, a common electrode 2 is formed on the insulating layer, then another insulating layer 3 is formed, and pixel electrodes 4 are formed on the insulating layer 3. For a color film substrate arranged opposite to the array substrate, it comprises a black matrix 7 and a color film 6. A liquid crystal layer 5 is sandwiched between the array substrate and the color film substrate. The pixel electrodes 4 are fabricated as slit structures, and a driving electric field 8 is formed between the pixel electrodes 4 and the common electrode 2 for driving liquid crystals, thereby realizing image display. However, for a display device in the FFS display mode, the driving electric field at the edge of each pixel is much weaker than the driving electric field within the pixel, such that the liquid crystals are hardly deflected, so the light transmittance at the edge of the pixel is relatively low, which influences a display effect.

SUMMARY OF THE INVENTION

Embodiments of the present invention provide an array substrate and a manufacturing method thereof, as well as a display device, which can increase transmittance at the edge of a pixel, thereby improving a display effect.

In order to achieve the above object, the embodiments of the present invention adopt the following technical solutions:

According to an aspect of the present invention, an array substrate is provided, comprising: a common electrode and pixel electrodes, the array substrate further comprising an auxiliary common electrode arranged between adjacent pixel electrodes and electrically connected with the common electrode.

Optionally, the auxiliary common electrode is in a strip shape.

Further, the array substrate may further comprise a data line, the auxiliary common electrode being located above the data line and arranged to be opposite to the data line.

Further, the array substrate may further comprise a gate line, the auxiliary common electrode being arranged to be opposite to the gate line.

Optionally, the auxiliary common electrode and the pixel electrodes are arranged in the same layer.

Optionally, the array substrate further comprises an insulating layer arranged between the pixel electrodes and the common electrode; the auxiliary common electrode being electrically connected with the common electrode through a via hole that penetrates the insulating layer.

Optionally, the pixel electrodes are slit electrodes.

Optionally, the common electrode is a plate electrode.

According to another aspect of the present invention, a display device is further provided, which may comprise the above array substrate.

According to a further aspect of the present invention, a method for manufacturing an array substrate is further provided, comprising: forming a common electrode; and forming pixel electrodes, wherein the method further comprises forming an auxiliary common electrode arranged between adjacent pixel electrodes and electrically connected with the common electrode.

In the array substrate and the manufacturing method thereof as well as the display device provided by the embodiments of the present invention, an auxiliary common electrode is additionally arranged between the adjacent pixel electrodes, and the auxiliary common electrode is electrically connected with the common electrode. In this way, in addition to the electric field formed between the pixel electrodes and the common electrode, the pixel electrodes can also form an additional auxiliary electric field with the auxiliary common electrode so as to drive the liquid crystal molecules at the edge of a pixel, so, the driving electric field at the edge of the pixel will be strengthened, so that the liquid crystal molecules will be deflected more sufficiently, and the transmittance will be higher. Therefore, the technical solutions of the embodiments of the present invention can increase the transmittance at the edge of the pixel, and improve the display effect.

BRIEF DESCRIPTION OF THE DRAWINGS

In order to explain the technical solutions in the embodiments of the present invention more clearly, the drawings to be used in the embodiments will be introduced briefly next. Apparently, the drawings described below are only some embodiments of the present invention, for the ordinary skilled person in the art, other drawings can also be obtained from these drawings.

FIG. 1 is a structural schematic view of an existing FFS mode display device;

FIG. 2 is a structural schematic view of an array substrate provided by an embodiment of the present invention;

REFERENCE SIGNS

Figure 3:
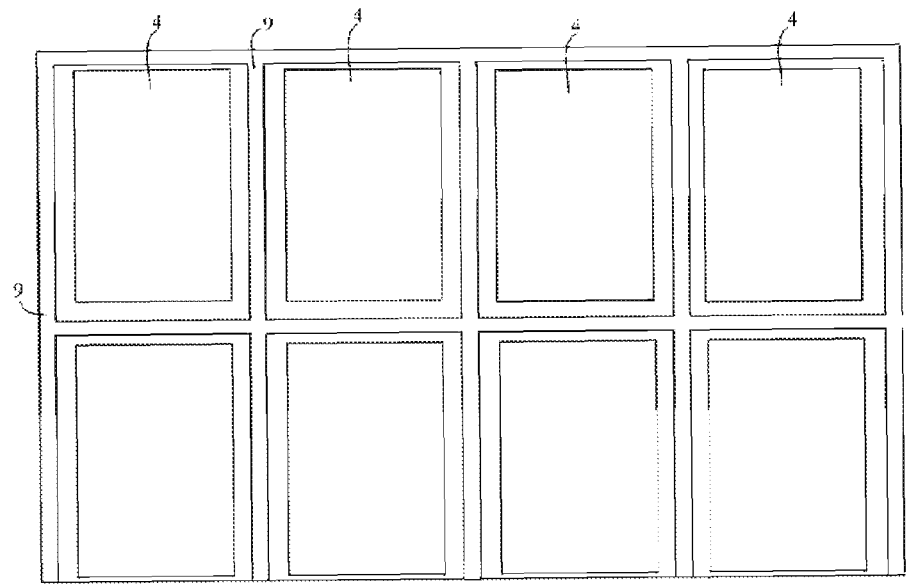
FIG. 3 is a planar structural schematic view of a layer where the pixel electrodes and the auxiliary common electrode locate in a specific implementing mode of an embodiment of the present invention.

1—data line, 2—common electrode, 3—insulating layer, 4—pixel electrode, 5—liquid crystal, 6—color film, 7—black matrix, 8—driving electric field, 9—auxiliary common electrode, 10—via hole.

DETAILED DESCRIPTION OF THE INVENTION

Next, the technical solutions in the embodiments of the present invention will be described clearly and completely in combination with drawings in the embodiments of the present invention. The embodiments described are only part of rather than all of the embodiments of the present invention.

An embodiment of the present invention provides an array substrate, as shown in FIG. 2. The array substrate comprises: a common electrode 2 and pixel electrodes 4. In addition to this, the array substrate further comprises an auxiliary common electrode 9 arranged between adjacent pixel electrodes 4 and electrically connected with the common electrode 2. Specifically, the number of the pixel electrodes 4 is multiple.

The array substrate provided by the embodiment of the present invention is adapted for use in a display device in a plane field mode, such as a display device in a FFS, an IPS (In Plane Switching), or an ADS (Advanced-Super Dimensional Switching) mode. An auxiliary common electrode 9 is arranged additionally between adjacent pixels, and the auxiliary common electrode 9 is electrically connected with the common electrode 2. In this way, in addition to the electric field formed between the pixel electrodes and the common electrode, the pixel electrodes can also form an additional auxiliary electric field (as shown by the broken line in FIG. 2) with the auxiliary common electrode so as to drive the liquid crystal molecules at the edge of the pixels. Compared with the prior art, the technical solution of this embodiment can increase the transmittance at the edge of the pixels, and improve the display effect.

Optionally, the above auxiliary common electrode 9 may be in a strip shape. More specifically, the auxiliary common electrode 9 can be arranged between any two pixel electrodes, and in a strip shape. Moreover, its length direction can be parallel to the edges of the pixel electrodes.

Optionally, the above array substrate may further comprise a data line 1. The auxiliary common electrode 9 can be located above the data line 1 and arranged to be opposite to the data line 1. Further, the array substrate may further comprise a gate line (not shown in the figure). The auxiliary common electrode 9 can be further arranged to be opposite to the gate line. Optionally, the auxiliary common electrode 9 is located above the gate line. In addition, the array substrate may further comprise a thin film transistor (not shown in the figure) arranged at a position where the data line overlaps with the gate line. Since the structures of the data line, the gate line and the thin film transistor are well known by the skilled person in the art, they will not be repeated here.

Optionally, the above auxiliary common electrode 9 may be arranged in the same layer as the pixel electrodes 4. In this way, when the auxiliary common electrode is fabricated, it can be formed simultaneously with the pixel electrodes 4, without the need to add extra processes.

Further, for the auxiliary common electrode 9 arranged in the same layer as the pixel electrodes 4, it can be located at an interval between adjacent pixel electrodes 4. For example, as shown in FIG. 3, the auxiliary common electrode 9 is in a crisscross lattice pattern formed along the extending direction of the data line and the extending direction of the gate line, and the pixel electrodes 4 are located in the middle of the lattices.

Further, the array substrate may further comprise an insulating layer 3 arranged between the pixel electrodes 4 and the common electrode 2; the auxiliary common electrode 9 is electrically connected with the common electrode 2 through a via hole 10 that penetrates the insulating layer 3. The above pixel electrodes 4 may be slit electrodes; the common electrode 3 may be a plate electrode, and may also be a slit electrode.

The array substrate provided by this embodiment is adapted for use in a display device in a plane field mode, such a display device in a FFS, an IPS, or an ADS mode, which can increase the transmittance at the edge of a pixel, avoid display non-uniformity, and improve display effect.

Figure 4:
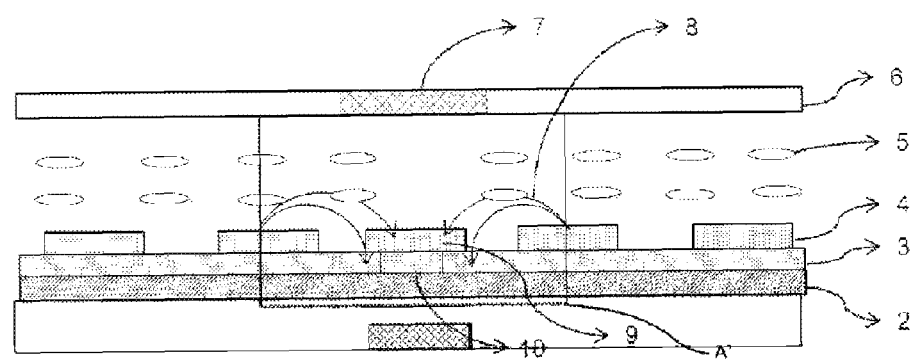
FIG. 4 is a structural schematic view of a FFS mode display device provided by an embodiment of the present invention.

As shown in FIG. 4, an embodiment of the present invention further provides a display device, which may comprise any of the above array substrates. The display device may further comprise a color film substrate comprising a color film 6 and a black matrix 7. Liquid crystals 5 are sandwiched between the array substrate and the color film substrate. The difference between the transmittance at the edge of a pixel and the transmittance at the center of the pixel of the display device decreases, such that display uniformity is improved, thereby being capable of obtaining higher display quality. The display device may be any product or component with the display function such as a liquid crystal panel, electronic paper, a mobile phone, a panel computer, a television, a display, a laptop, a digital photo frame, a navigator etc.

An embodiment of the present invention further provides a method for manufacturing an array substrate, comprising: forming a common electrode; and forming pixel electrode. The manufacturing method further comprises forming an auxiliary common electrode arranged between adjacent pixel electrodes and electrically connected with the common electrode.

The pattern of the auxiliary common electrode in this embodiment may refer to the above explanations, which will not be repeated here. Optionally, the process of forming the pixel electrodes can be accomplished simultaneously with the process of forming the auxiliary common electrode, thus it does not have to add extra processes due to the auxiliary common electrode.

Referring to FIG. 2 as an example, the method for manufacturing an array substrate provided by the embodiment of the present invention will be explained in detail. An insulating layer is formed after a data line 1 is fabricated on a substrate, a common electrode 2 is formed on the insulating layer, then another insulating layer 3 is formed, and pixel electrodes 4 are formed on the insulating layer 3. In the process of forming the pixel electrodes, an additional auxiliary common electrode 9 can be further formed simultaneously between the adjacent pixel electrodes. The auxiliary common electrode 9 is electrically connected with the common electrode 2 through a via hole 10 that penetrates the insulating layer 3. Due to presence of the auxiliary common electrode 9, the electric field at the edge of the pixels will be strengthened, such that the liquid crystal molecules will be deflected more sufficiently, thereby enabling the transmittance to be higher. In addition, before forming the data line, a gate line and a thin film transistor can be formed. Since the process of forming the data line, the gate line and the thin film transistor is well known by the skilled person in the art, it will not be repeated here.

Figure 5:
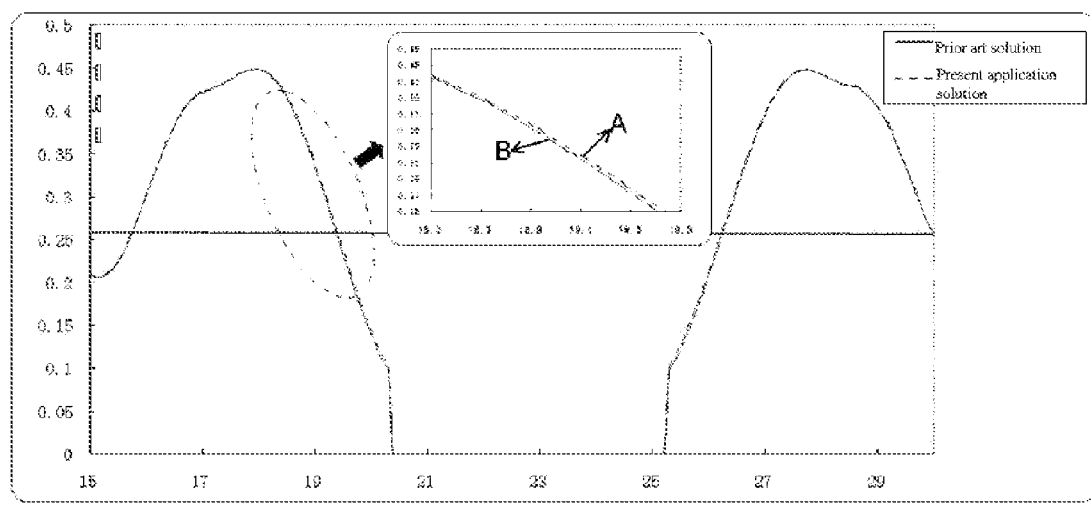
FIG. 5 is a simulated diagram of transmittance distribution comparison of a display device of the prior art and a display device provided by an embodiment of the present invention.

FIG. 5 shows a comparison result diagram of a simulated experiment of transmittance distribution of the prior art solution (the solution in which the auxiliary common electrode is not arranged) and the solution according to an embodiment of the present invention (the solution in which the auxiliary common electrode is arranged). In FIG. 5, the curve A is the simulation result of transmittance distribution of the solution according to the embodiment of the present invention, and the curve B is the simulation result of the transmittance distribution of the prior art solution. The longitudinal coordinates of FIG. 5 shows relative luminance. In FIG. 5, for the curve A, the horizontal coordinates shows the transverse of the block areas A' in FIG. 2 and FIG. 4; for the curve B, the horizontal coordinates shows the transverse of the block area A in FIG. 1. It can be seen from FIG. 5 that the light transmission area is closer to the direction of the data line 1 in the solution according to the embodiment of the present invention, so the transmittance is higher. The specific simulated display experiment indicates that the whole pixel transmittance is increased by 4.5%.

The method for manufacturing an array substrate provided by this embodiment is adapted for use in a display device in a plane field mode, such as a display device in a FFS, an IPS or an ADS mode. In particular, an auxiliary common electrode can be formed simultaneously between the adjacent pixel electrodes when the pixel electrodes are formed, thereby being capable of increasing transmittance at the edge of the pixels, avoiding display non-uniformity and improving display effect. Moreover, no extra process needs to be added.

The above descriptions are only specific implementing modes of the present invention. However, the protection scope of the present invention is not limited to this disclosure. Any variations or replacements within the technical scope disclosed by the present disclosure that can be easily conceived by the skilled person familiar with the present technical field should all be encompassed within the protection scope of the present invention. Therefore, the protection scope of the present invention should depend on protection scopes of claims.

The invention claimed is:

1. An array substrate comprising: a common electrode and pixel electrodes,
    wherein the array substrate further comprises an auxiliary common electrode arranged between adjacent pixel electrodes and electrically connected with the common electrode,
    wherein the array substrate further comprises a data line and a gate line, and the auxiliary common electrode is in a crisscross lattice pattern formed along an extending direction of the data line and an extending direction of the gate line, and
    wherein the auxiliary common electrode and the pixel electrodes are arranged in the same layer.

2. The array substrate according to claim 1, wherein the auxiliary common electrode is located above the data line and arranged to be opposite to the data line.

3. The array substrate according to claim 2, wherein the auxiliary common electrode is arranged to be opposite to the gate line.

4. The array substrate according to claim 1, further comprising an insulating layer arranged between the pixel electrodes and the common electrode, the auxiliary common electrode being electrically connected with the common electrode through a via hole that penetrates the insulating layer.

5. The array substrate according to claim 1, wherein the pixel electrodes are slit electrodes.

6. The array substrate according to claim 1, wherein the common electrode is a plate electrode.

7. A display device comprising an array substrate according to claim 1.

8. The display device according to claim 7, wherein the auxiliary common electrode is located above the data line and arranged to be opposite to the data line.

9. The display device according to claim 8, wherein the auxiliary common electrode is arranged to be opposite to the gate line.

10. The display device according to claim 7, further comprising an insulating layer arranged between the pixel electrodes and the common electrode, the auxiliary common electrode being electrically connected with the common electrode through a via hole that penetrates the insulating layer.

11. The display device according to claim 7, wherein the pixel electrodes are slit electrodes.

12. The display device according to claim 7, wherein the common electrode is a plate electrode.

13. A method for manufacturing an array substrate, comprising:
    forming a common electrode; and
    forming pixel electrodes,
        wherein the method further comprises forming an auxiliary common electrode arranged between adjacent pixel electrodes and electrically connected with the common electrode, and
        wherein the method further comprises forming a data line and a gate line, and the auxiliary common electrode is in a crisscross lattice pattern formed along an extending direction of the data line and an extending direction of the gate line, and
        wherein the auxiliary common electrode and the pixel electrodes are arranged in the same layer.

* * * * *